United States Patent
Akamatsu et al.

(10) Patent No.: US 6,492,665 B1
(45) Date of Patent: Dec. 10, 2002

(54) SEMICONDUCTOR DEVICE

(75) Inventors: Susumu Akamatsu, Osaka (JP); Toshitaka Hibi, Kyoto (JP); Takehiko Ueda, Kyoto (JP); Tadami Shimizu, Osaka (JP); Yoshiaki Kato, Hyogo (JP); Tatsuya Obata, Toyama (JP); Toyoyuki Shimazaki, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/714,130

(22) Filed: Nov. 17, 2000

Related U.S. Application Data

(63) Continuation of application No. 09/361,219, filed on Jul. 27, 1999, now Pat. No. 6,180,472.

(30) Foreign Application Priority Data

Jul. 28, 1998 (JP) .......................................... 10-212156

(51) Int. Cl.$^7$ ............................................. H01L 31/072
(52) U.S. Cl. ....................... 257/192; 257/344; 257/408; 257/900
(58) Field of Search ................................. 257/408, 384, 257/344, 366, 405, 406, 410, 346

(56) References Cited

U.S. PATENT DOCUMENTS

| | | | | |
|---|---|---|---|---|
| 5,324,974 A | * | 6/1994 | Liao | ............................ 257/344 |
| 5,895,955 A | | 4/1999 | Gardner et al. | |
| 5,920,104 A | | 7/1999 | Nayak et al. | |
| 5,925,912 A | | 7/1999 | Arai et al. | |
| 5,936,279 A | * | 8/1999 | Chuang | ........................ 257/346 |
| 5,952,700 A | | 9/1999 | Yoon | |
| 5,990,530 A | | 11/1999 | Suzuki | |
| 6,040,222 A | | 3/2000 | Hsu et al. | |

FOREIGN PATENT DOCUMENTS

| | | |
|---|---|---|
| JP | 62-118578 | 5/1987 |
| JP | 1-201963 | 8/1989 |
| JP | 03-110729 | 9/1991 |
| JP | 5-21455 | 1/1993 |
| JP | 09-199589 | 1/1996 |
| JP | 09-289249 | 11/1997 |
| JP | 10-12879 | 1/1998 |

* cited by examiner

*Primary Examiner*—David Nelms
*Assistant Examiner*—Dung Anh Le
(74) *Attorney, Agent, or Firm*—Nixon Peabody LLP; Donald R. Studebaker

(57) ABSTRACT

After a gate insulating film, a gate electrode and an on-gate protective layer have been formed in this order on an Si substrate, lightly-doped source/drain regions are formed in the substrate. First and second sidewalls are formed on the sides of the gate electrode and then heavily-doped source/drain regions are formed by implanting dopant ions using these sidewalls as a mask. After the second sidewall has been selectively removed, pocket implanted regions are formed and an overall protective film is deposited. Thereafter, an interlevel dielectric film is deposited, contact holes are formed to reach the heavily-doped source/drain regions and then plug electrodes are formed. Since the second sidewall has already been removed when the overall protective film is deposited, the gap between adjacent gate electrodes is not completely filled in. Accordingly, it is possible to provide a method for fabricating a semiconductor device contributing to device miniaturization without causing a shortcircuit between the gate electrode and a contact member.

16 Claims, 10 Drawing Sheets

SEMICONDUCTOR DEVICE

This application is a continuation of application Ser. No. 09/361,219 filed Jul. 27, 1999 now U.S. Pat. No. 6,180,472.

BACKGROUND OF THE INVENTION

The present invention relates to a method for fabricating a semiconductor device including self-aligned contacts.

In recent years, when contact members are formed to be interconnected to the source/drain regions of an MOS transistor, a self-aligned contact (SAC) structure is sometimes used to further increase the density of devices integrated on a chip. Specifically, in such a structure, a sidewall, which has been used for forming an LDD structure, is used again as an etch stopper for forming contacts in a self-aligned manner.

FIGS. 7(a) through 7(d) are cross-sectional views illustrating a conventional method for fabricating an MOS transistor with a known self-aligned contact structure. An LDD structure is often used recently for a transistor to meet the downsizing requirement. According to an ordinary method for fabricating such a transistor with an LDD structure, a sidewall is formed on a side of a gate electrode and heavily doped source/drain regions are formed by implanting ions into a substrate with that sidewall used as a mask.

First, in the process step shown in FIG. 7(a), a gate oxide film 102 (e.g., a thermal oxide film), a polysilicon film 103 for forming a gate electrode and a silicon nitride film 104 are formed in this order on a semiconductor substrate 101. And then a resist film 105 for patterning the gate is formed on the silicon nitride film 104.

Next, in the process step shown in FIG. 7(b), the silicon nitride film 104 and polysilicon film 103 are etched in this order using the resist film 105 as an etching mask, thereby forming an on-gate protective layer 104a and a gate electrode 103a. Thereafter, dopant ions are implanted into the semiconductor substrate 101 using the gate electrode 103a and the on-gate protective layer 104a as a mask, thereby forming lightly-doped source/drain regions 106. In this process step, phosphorus or arsenic ions are implanted to form an n-channel MOS transistor, or boron ions are implanted to form a p-channel MOS transistor. Then, a CVD oxide film 107 and a CVD nitride film 108 are deposited in this order over the substrate.

Subsequently, in the process step shown in FIG. 7(c), the CVD oxide film 107 and CVD nitride film 108 are dry-etched anisotropically to form an oxide sidewall 107a and a nitride sidewall 108a on a side of the gate electrode 103a.

Thereafter, in the process step shown in FIG. 7(d), dopant ions are implanted into the semiconductor substrate 101 using the gate electrode 103a and the oxide and nitride sidewalls 107a and 108a as a mask, thereby forming heavily-doped source/drain regions 109. In this process step, phosphorus or arsenic ions are implanted to form an n-channel MOS transistor, or boron ions are implanted to form a p-channel MOS transistor. In this manner, an MOS transistor with an LDD structure is completed.

In a self-aligned contact structure, the nitride sidewall 108a formed in the above-described manner is used as an etch stopper in the process step of forming contact holes, thereby preventing the gate electrode from coming into electrical contact with the contact members.

FIG. 8 illustrates an exemplary cross section of an MOS transistor in which contact members have been formed. As shown in FIG. 8, an interlevel dielectric film 110 of silicon dioxide is deposited over the MOS transistor with the LDD structure shown in FIG. 7(d), and then planarized. Thereafter, contact holes are formed in the interlevel dielectric film 110 by photolithography and etching techniques so as to reach the heavily-doped source/drain regions 109. In this process step, even if part of a contact hole interferes with the on-gate protective layer 104a or the nitride sidewall 108a, the on-gate protective layer 104a or the nitride sidewall 108a is hardly etched. This is because the etch selectivity of the $SiO_2$ interlevel dielectric film 110 to the SiN on-gate protective layer 104a or the nitride sidewall 108a is high. In other words, since the on-gate protective layer 104a and the nitride sidewall 108a serve as an etch stopper in the process step of forming contact holes, the gate electrode 103a can be protected. Thereafter, the contact holes are filled in with plug electrodes 111 and an interconnection layer (not shown) is formed thereon.

The nitride sidewall 108a is used not only as an ion implant mask for forming the heavily doped source/drain regions 109, but also as an etch stopper for protecting the gate electrode 103a in the process step of forming self-aligned contacts during the fabrication of an MOS transistor with SAC and LDD structures. However, it is already known that the direct contact of the nitride sidewall 108a with the side of the gate electrode 103a is likely to deteriorate the characteristics of the transistor. Thus, in the illustrated example, the thin oxide sidewall 107a is interposed between the gate electrode 103a and the nitride sidewall 108a.

However, if a contact hole is formed to reach a region above the gate electrode 103a as shown in FIG. 8, then the upper edge of the oxide sidewall 107a is exposed inside the contact hole. And if that edge of the oxide sidewall 107a is etched away, then the resultant gap between the on-gate protective layer 104a and the nitride sidewall 108a is likely to be further removed. As a result, the contact hole might possibly reach the gate electrode 103a. That is to say, the plug electrode 111 as a contact member might be electrically short-circuited with the gate electrode 103a.

To solve such a problem, the process steps shown in FIGS. 9(a) and 9(b) are carried out after the MOS transistor has been formed by performing the process steps shown in FIGS. 7(a) through 7(d). Specifically, the MOS transistor is covered with a relatively thick CVD nitride film 112, an interlevel dielectric film 110 is deposited over the entire surface of the substrate, and then contact holes are formed in the interlevel dielectric film 110. In such a case, the progress of etching is blocked by the CVD nitride film 112 by the time the contact hole has gone through the interlevel dielectric film 110 as shown in FIG. 9(b). Accordingly, it is possible to prevent the contact hole from reaching the gate electrode 103a with certainty.

The conventional process for fabricating a semiconductor device with an SAC structure, however, has the following drawbacks.

Specifically, if a relatively thick CVD nitride film 112 is deposited, then the gap between a pair of gate electrodes 103a for adjacent MOS transistors might be completely filled in with the CVD nitride film 112 as shown in FIG. 10. In general, since the gate length and pitch have recently been reduced to about 0.15 $\mu$m and about 0.4 $\mu$m, respectively, the gap between the gates is as small as approximately 0.25 $\mu$m. In this particular LDD/SAC structure, the gap gets even smaller when taking the respective thicknesses of the oxide and nitride sidewalls into account. Accordingly, the gap is very likely to be totally filled in. In such a situation, it is virtually impossible to form such contact holes as reaching the source/drain regions 109 located under the gaps filled in with the CVD nitride film 112 as shown in FIG. 10. This is because other members might be adversely affected if such contact holes are provided.

SUMMARY OF THE INVENTION

An object of the present invention is providing a method for fabricating a semiconductor device, which functions as an MIS transistor with an SAC structure and can contribute to device miniaturization, by forming self-aligned contacts while improving the reliability thereof.

A method for fabricating a semiconductor device according to the present invention includes the steps of: a) forming a gate insulating film, a gate electrode and an on-gate protective layer in this order on a semiconductor substrate; b) implanting dopant ions into the semiconductor substrate using the gate electrode and the on-gate protective layer as a mask, thereby forming lightly-doped regions in the semiconductor substrate; c) depositing a first insulating film and a masking film in this order over the substrate, the masking film being able to be etched selectively with respect to the first insulating film; d) anisotropically etching the first insulating film and the masking film such that a first sidewall is formed on respective sides of the gate electrode and the on-gate protective layer by partially leaving the first insulating film thereon and that a second sidewall is formed on the first sidewall by partially leaving the masking film thereon; e) implanting dopant ions into the semiconductor substrate using the on-gate protective layer, the gate electrode and the first and second sidewalls as a mask, thereby forming heavily-doped regions in the semiconductor substrate; f) selectively removing the second sidewall so as to leave the first sidewall after the step e) has been performed; g) depositing a second insulating film over the substrate so as cover at least the on-gate protective layer and the first sidewall after the step f) has been performed; h) depositing an interlevel dielectric film over the substrate after the step g) has been performed, the interlevel dielectric film being made of a material that is able to be etched selectively with respect to the second insulating film; i) etching the interlevel dielectric film to form therein openings reaching the heavily-doped regions; and j) filling the openings in with plug electrodes made of a conductive material.

According to this method, since the second sidewall still exists in the step e), the heavily-doped regions can be formed in respective regions that are offset from the lightly-doped regions, thus obtaining an MIS transistor with a so-called LDD structure. On the other hand, since the second sidewall no longer exists in the step g), a sufficiently wide gap is ensured between a pair of gate electrodes of adjacent transistors. And it is possible to prevent the gap from being completely filled in with the second insulating film. Accordingly, a highly reliable, downsized semiconductor device with an SAC structure can be provided thanks to the existence of the second insulating film.

In one embodiment of the present invention, a Non-Doped Silicate Glass (NSG) film may be formed as the first insulating film and a PSG or BPSG film may be formed as the masking film in the step c).

In such an embodiment, a predetermined etch selectivity is ensured between the first and second sidewalls without causing any adverse effects such as a stress in the operating region of the semiconductor device.

In this particular embodiment, if the step f) is performed by HF vapor phase etching, only the second sidewall can be removed at a high etch selectivity.

In another embodiment, the method may further include the step of implanting dopant ions into the semiconductor substrate using the on-gate protective layer, the gate electrode and the first sidewall as a mask to form pocket implanted layers in the semiconductor substrate between the steps f) and g).

In such an embodiment, a semiconductor device can be formed with its punchthrough stop capability enhanced.

In still another embodiment, the method may further include, between the steps e) and f), the steps of: forming a protective film over the semiconductor substrate, the protective film being used as a mask for a non-silicide region; forming lightly-doped regions for preventing leakage under the heavily-doped regions using the protective film as a mask; selectively removing part of the protective film, which covers a silicide region, so as to leave the other part thereof covering the non-silicide region; and forming a silicide layer on the surface of the heavily-doped regions.

In such an embodiment, the lightly-doped regions for preventing leakage can be formed by using the protective film, which is also used as a mask for a silicidation process step. These lightly-doped regions for preventing leakage can reduce not only leakage current, but also junction capacitance. In addition, the silicide layer can reduce sheet resistance. As a result, the operating speed of the semiconductor device can be further increased.

A second method for fabricating a semiconductor device according to the present invention includes the steps of: a) forming a gate insulating film, a gate electrode and an on-gate protective layer in this order on a semiconductor substrate; b) depositing a first insulating film and a masking film in this order over the substrate, the masking film being able to be etched selectively with respect to the first insulating film; c) anisotropically etching the first insulating film and the masking film such that a first sidewall is formed on respective sides of the gate electrode and the on-gate protective layer by partially leaving the first insulating film thereon and that a second sidewall is formed on the first sidewall by partially leaving the masking film thereon; d) implanting dopant ions into the semiconductor substrate using the on-gate protective layer, the gate electrode and the first and second sidewalls as a mask, thereby forming heavily-doped regions in the semiconductor substrate; e) selectively removing the second sidewall so as to leave the first sidewall after the step d) has been performed; f) implanting dopant ions into the semiconductor substrate using the gate electrode, the on-gate protective layer and the first sidewall as a mask, thereby forming lightly-doped regions in the semiconductor substrate; g) depositing a second insulating film over the substrate so as cover at least the on-gate protective layer and the first sidewall after the step f) has been performed; h) depositing an interlevel dielectric film over the substrate after the step g) has been performed, the interlevel dielectric film being made of a material that is able to be etched selectively with respect to the second insulating film; i) etching the interlevel dielectric film to form therein openings reaching the heavily-doped regions; and j) filling the openings in with plug electrodes made of a conductive material.

According to the second method, the same effects as those attained by the first method are also attainable as a matter of principle. In addition, according to the second method, the lightly-doped regions are formed after the heavily-doped regions have been formed. Thus, annealing for activating the dopant in the heavily-doped regions can be conducted at a temperature high enough to increase the diffusion depth thereof sufficiently. As a result, the junction capacitance can be reduced. And at the same time, annealing for activating the dopant in the lightly-doped regions can be conducted at either a low temperature or a high temperature but for just a short period of time so as to suppress the short channel effects.

The same additional process steps as those of the first method are also applicable to the second method.

DESCRIPTION OF THE PREFERRED EMBODIMENTS

Hereinafter, preferred embodiments of the present invention will be described with reference to the accompanying drawings.

Embodiment 1

FIGS. 1(a) through 1(d) are cross-sectional views illustrating respective process steps for fabricating an n-channel MIS transistor, which is an exemplary semiconductor device according to a first embodiment of the present invention. As a matter of principle, the same process steps as those illustrated in FIGS. 1(a) through 1(d) are performed to form a p-channel MIS transistor, although the conductivity types of dopants implanted into respective parts of the MIS transistor are reversed in such a case.

Figure 1A:
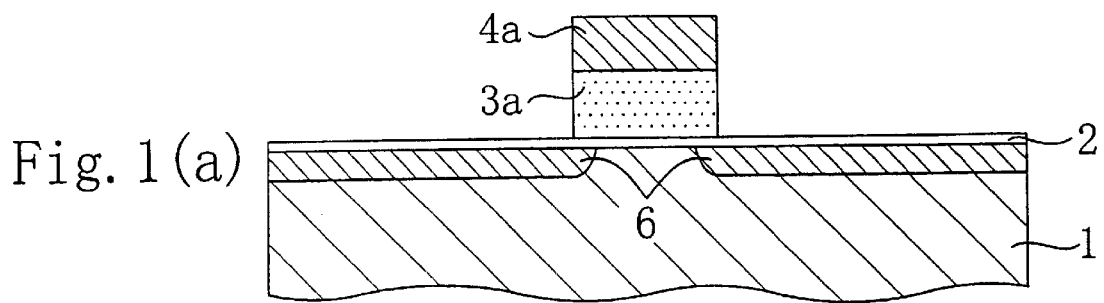
FIGS. 1(a) through 1(d) are cross-sectional views illustrating respective process steps for fabricating a semiconductor device according to a first embodiment of the present invention up to a point in time lightly-doped source/drain regions are formed.
Figure 7A:
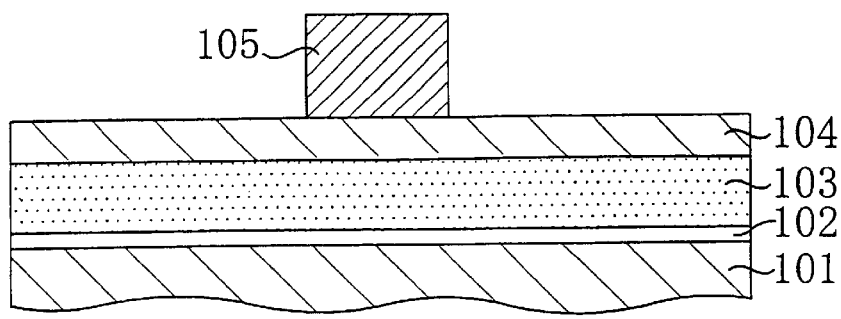
FIGS. 7(a) through 7(d) are cross-sectional views illustrating conventional process steps for fabricating a semiconductor device with known self-aligned contacts.

First, in the process step shown in FIG. 1(a), field oxide regions (not shown) are formed on an Si substrate 1, and the following process steps are performed to form an MIS transistor in an active region surrounded by the field oxide regions. Specifically, the principal surface of the Si substrate 1 is thermally oxidized to form a silicon dioxide film thereon to a thickness of about 3 nm. Then, the silicon dioxide film is nitrided, thereby forming a gate insulating film 2 of silicon oxynitride. Thereafter, a gate electrode 3a of polysilicon and an on-gate protective layer 4a of silicon nitride are formed in this order on the gate insulating film 2. In this case, the same process step as the conventional one illustrated in FIG. 7(a) is performed although not shown. Specifically, a polysilicon film and a silicon nitride film are deposited and patterned by photolithography and dry etching, thereby forming the gate electrode 3a and the on-gate protective layer 4a.

It should be noted that an n-type dopant (or a p-type dopant for a p-channel MIS transistor) has been introduced into the gate electrode 3a.

Next, using the gate electrode 3a and the on-gate protective layer 4a as a mask, P$^+$ (phosphorus) ions are implanted at a tilt angle of 7 to 40 degrees, with an acceleration voltage of 20 to 30 keV applied and at a dose of about $5 \times 10^{13}/cm^2$, thereby forming lightly-doped source/drain regions 6. It should be noted that extension regions may be formed instead of the lightly-doped source/drain regions 6. In such a case, arsenic (As) ions are implanted at a dose of about $5 \times 10^{14}/cm^2$ and with an acceleration voltage of 10 to 20 keV applied.

Figure 1B:
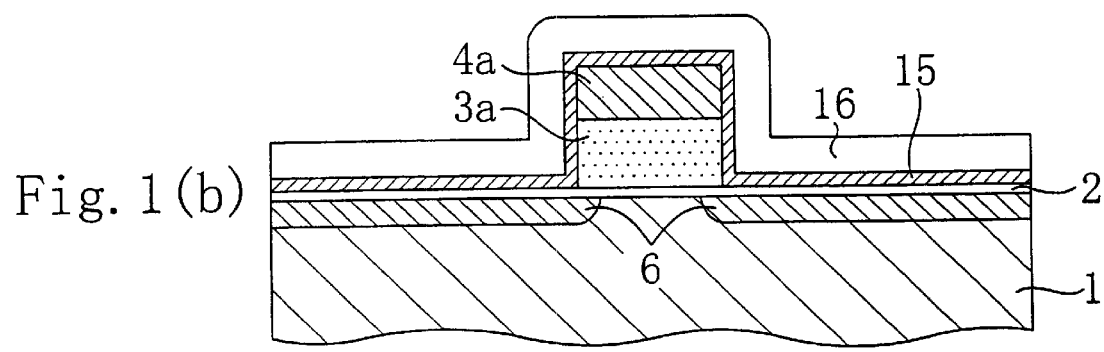

Next, in the process step shown in FIG. 1(b), a thin non-doped oxide film 15 (e.g., an NSG film) is deposited over the entire surface of the substrate to a thickness of 10 to 20 nm. Then, a doped oxide film 16 (e.g., a BPSG, PSG or BSG film) is deposited thereon to a thickness of 40 to 60 nm.

Figure 1C:
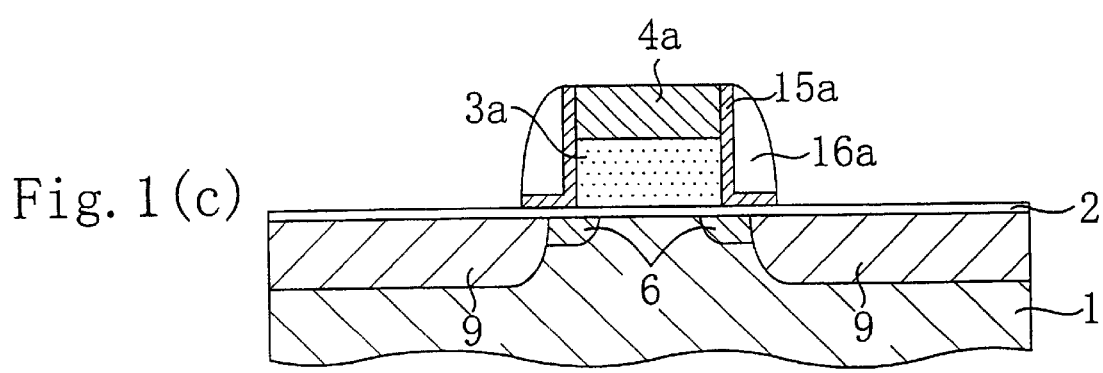

Subsequently, in the process step shown in FIG. 1(c), these oxide films 15 and 16 are etched anisotropically, thereby forming first and second sidewalls 15a and 16a on the sides of the gate electrode 3a. Thereafter, using the gate electrode 3a, on-gate protective layer 4a and respective sidewalls 15a and 16a as a mask, arsenic ions are implanted at a tilt angle of 7 degrees, with an acceleration voltage of 30 to 50 keV applied and at a dose of about 3 to about $5 \times 10^{15}/cm^2$, thereby forming heavily-doped source/drain regions 9.

It should be noted that a thin nitride film may be interposed between the first and second sidewalls 15a and 16a. The first and second sidewalls 15a and 16a need not be made of the materials exemplified above, but may be made of any materials so long as the second sidewall 16a can be selectively removed in the subsequent process step.

Figure 1D:
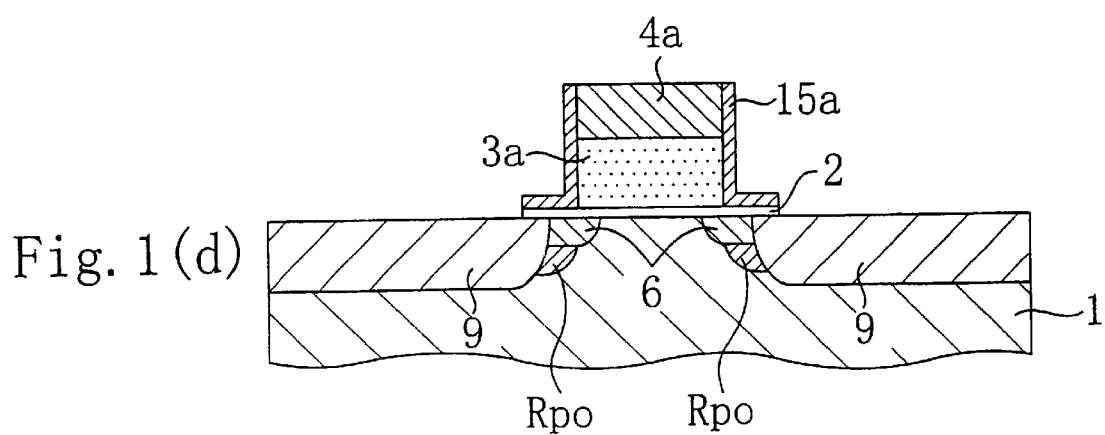

Next, in the process step shown in FIG. 1(d), only the second sidewall 16a is selectively removed so as to leave the first sidewall 15a. This selective etching can be performed easily as HF vapor phase etching. This is because in performing HF vapor phase etching, the etch rate of a doped oxide film such as a BPSG film is about two orders of magnitude higher than that of a non-doped oxide film such as an NSG film. Thus, the doped oxide film can be selectively removed easily. In this process step, portion of the gate insulating film 2, which is exposed on the substrate, is often etched away depending on the over-etch distance thereof.

Thereafter, using the gate electrode 3a, on-gate protective layer 4a and first sidewall 15a as a mask, boron (or boron fluoride) ions are implanted at a tilt angle of 20 to 40 degrees, with an acceleration voltage of 10 to 50 keV applied and at a dose of about 1 to about $5 \times 10^{13}/cm^2$, thereby forming pocket implanted regions Rpo as a punchthrough stopper. These pocket implanted regions Rpo do not have to be formed.

Subsequently, rapid thermal annealing (RTA) is conducted at a temperature of 900° C. to 1000° C. for 10 to 30 seconds to activate the dopants introduced into the respective regions 6, 9 and Rpo.

Figure 2A:
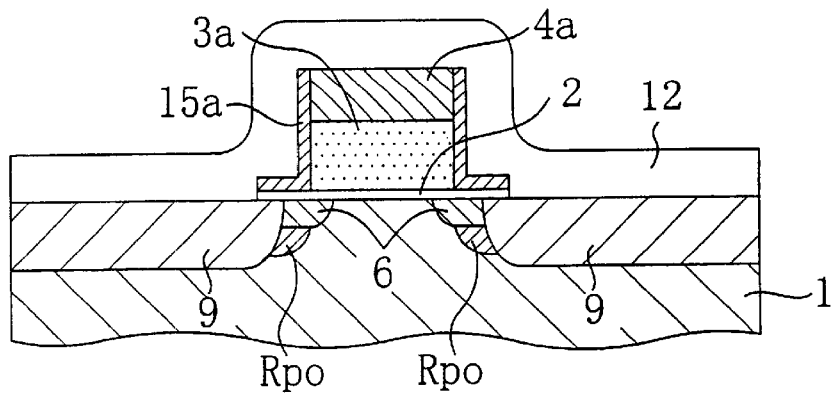
FIGS. 2(a) through 2(c) are cross-sectional views illustrating respective process steps of forming self-aligned contacts in the method for fabricating a semiconductor device according to the first embodiment.
Figure 2B:
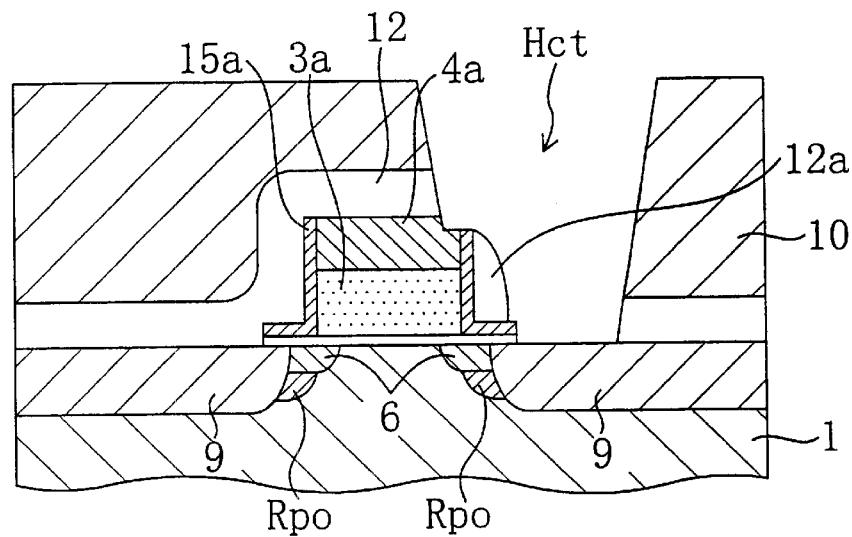
Figure 2C:
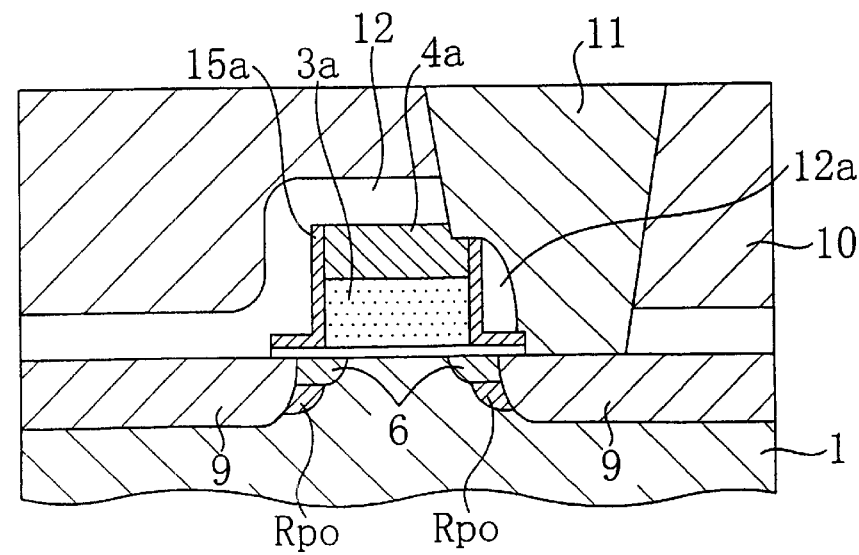

Then, the process steps of forming self-aligned contacts are performed as shown in FIGS. 2(a) through 2(c). In this specification, the self-aligned contacts mean contacts that can be formed without providing any margin corresponding to a mask-to-mask placement error between a mask for forming a gate electrode and a mask for forming contact holes.

First, in the process step shown in FIG. 2(a), an overall protective film 12 of silicon nitride is deposited by a CVD process over the entire surface of the substrate to a thickness of 30 to 50 nm. In this process step, the overall protective film 12 may be made of any insulating material other than silicon nitride so long as the material shows a high etch selectivity with respect to an interlevel dielectric film to be formed in the subsequent process step.

Next, in the process step shown in FIG. 2(b), the interlevel dielectric film 10 is deposited over the entire surface of the substrate and the surface of the film 10 is planarized. Then, contact holes Hct are formed by photolithography and dry etching so as to pass through the interlevel dielectric film 10 and the overall protective film 12 and reach the heavily-doped source/drain regions 9. In this process step, when a contact hole Hct reaches and exposes a part of the overall protective film 12, the overall protective film 12 showing a high etch selectivity with respect to the interlevel dielectric film 10 functions as an etch stopper. After the desired portions of the interlevel dielectric film 10 have been removed, the etching gases are changed to remove parts of the overall protective film 12. In this manner, the contact holes Hct can be formed to be self-aligned with the gate electrodes 3a. In the example illustrated in FIG. 2(b), the contact hole Hct has reached the on-gate protective layer 4a due to a large mask-to-mask placement error. It should be noted that part of the overall protective film 12 is left as a sidewall 12a on the side of the first sidewall 15a exposed inside the contact hole Hct.

Thereafter, in the process step shown in FIG. 2(c), the contact hole Hct is filled in with a metal such as W or Al, thereby forming a plug electrode 11.

In the succeeding process steps (not shown), a metal interconnection layer is formed over the interlevel dielectric film 10 and the plug electrodes 11 and a multilevel interconnection structure is ordinarily formed by providing second interlevel dielectric film and second metal interconnection layer and so on.

According to the method of this embodiment, when the contact hole Hct is formed to pass through the interlevel dielectric film 10 and reach the source or drain region 9 in the step shown in FIG. 2(b), the gate electrode 3a and first sidewall 15a are totally covered with the overall protective film 12. Thus, the first sidewall 15a is not removed and the contact hole Hct does not reach the gate electrode 3a. When the contact hole Hct passes through the interlevel dielectric film 10 and reaches part of the overall protective film 12, the overall protective film 12, showing a high etch selectivity with respect to the interlevel dielectric film 10, serves as an etch stopper. Accordingly, an exposed part of the overall protective film 12 is etched away to a certain depth by the time the desired portions of the interlevel dielectric film 10 have been removed. However, since the etch depth is very small, the contact hole Hct neither pass through the overall protective film 12 nor reach the on-gate protective layer 4a or the first sidewall 15a by that time. Also, at a point in time the contact hole Hct has passed through the overall protective film 12, the on-gate protective layer 4a and the first sidewall 15a are partially removed by that over-etch depth, which is also very small.

Figure 9A:
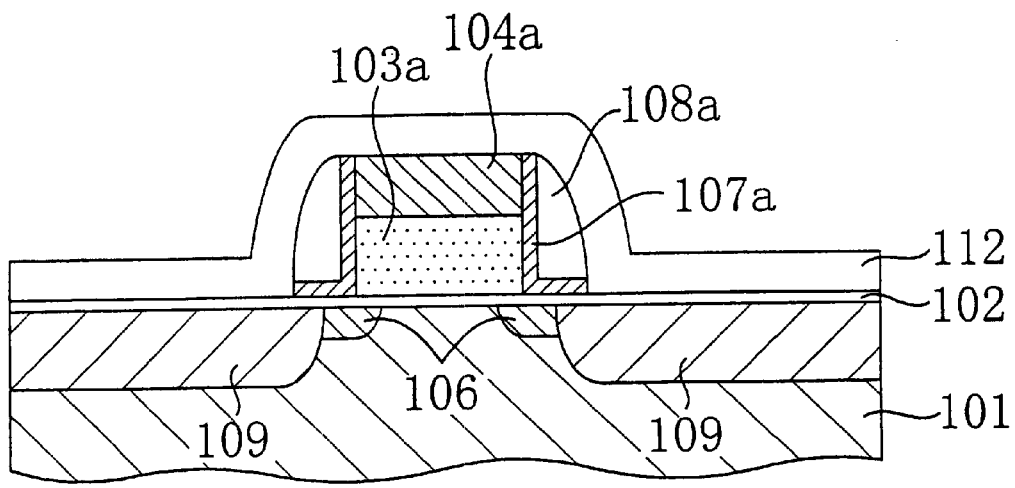
FIGS. 9(a) and 9(b) are cross-sectional views illustrating part of a conventional fabrication process of a semiconductor device including an overall nitride film.
Figure 9B:
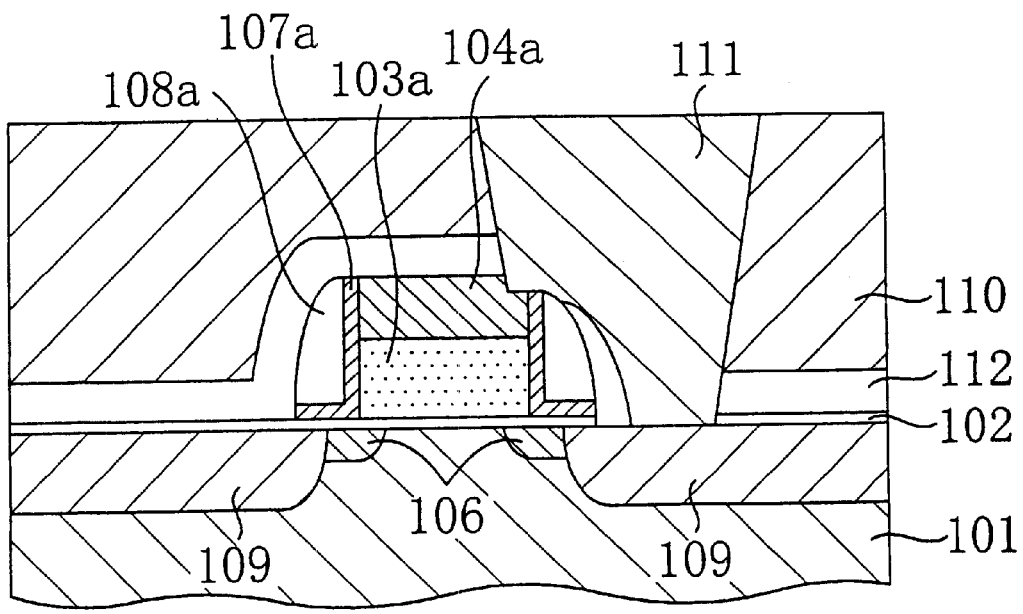

These effects are similar to those attained by the conventional method for fabricating a semiconductor device shown in FIGS. 9(a) and 9(b). According to the method of this embodiment, however, it is possible to prevent the gap between adjacent gate electrodes from being completely filled in with the overall protective film unlike the conventional process.

Figure 3:
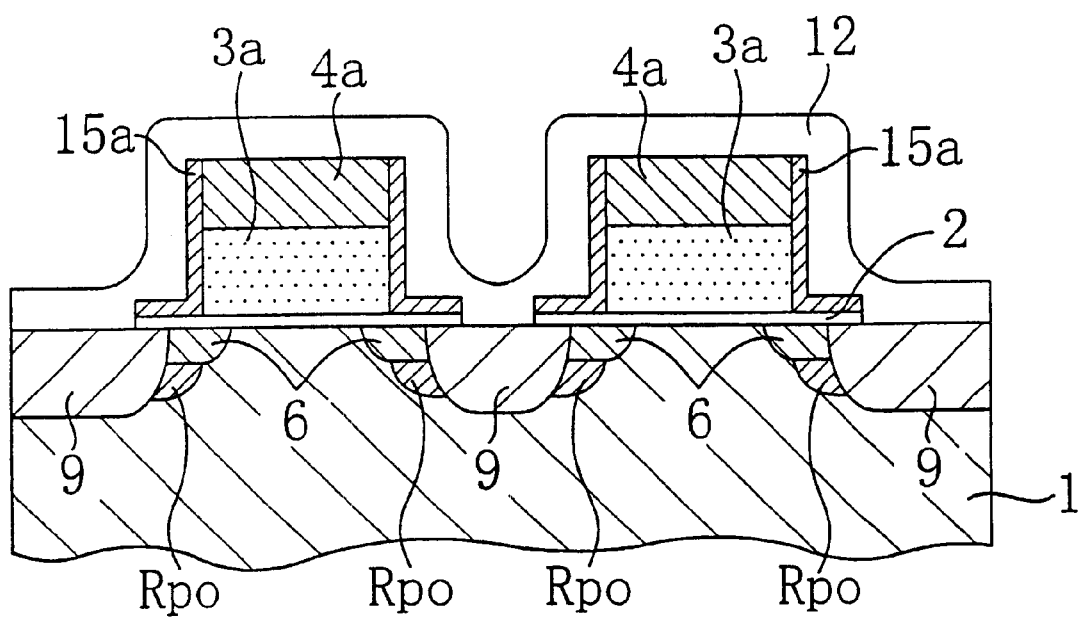
FIG. 3 is a cross-sectional view illustrating how an overall protective film is formed where adjacent gate electrodes are formed close to each other in the first embodiment.
Figure 10:
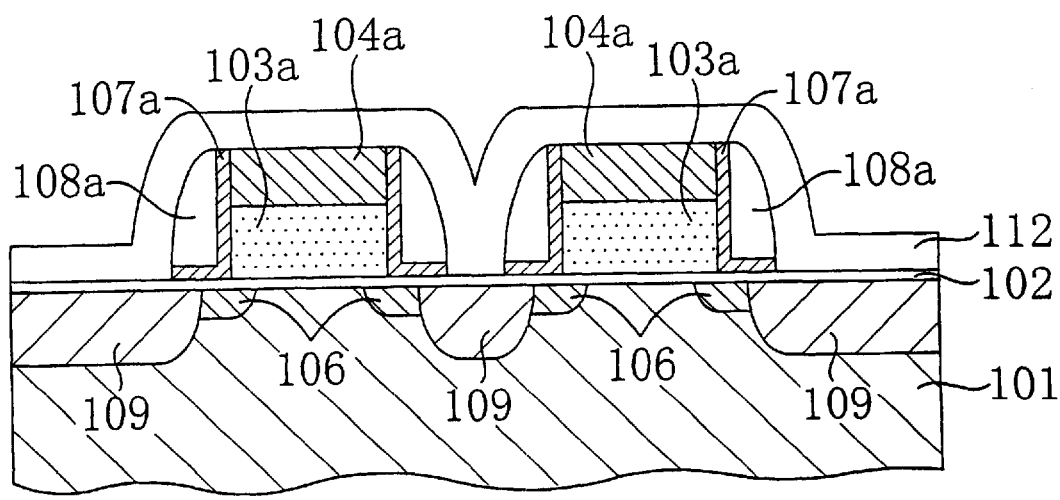
FIG. 10 is a cross-sectional view illustrating how the overall nitride film is formed where adjacent gate electrodes are formed close to each other in the conventional semiconductor device.

FIG. 3 is a cross-sectional view illustrating a pair of gate electrodes 3a of adjacent MIS transistors with a very narrow gap provided therebetween. According to this embodiment, since the second sidewall 16a, which is equivalent to the nitride sidewall 108a shown in FIG. 10, has been removed, the gap between the gate electrodes 3a has widened by the thickness thereof. Thus, this gap is not entirely filled in with the overall protective film 12. For example, if the gate length is 0.15 $\mu$m and the pitch between adjacent gate electrodes is 0.4 $\mu$m, then the gap between the adjacent gate electrodes is 0.25 $\mu$m. If the thickness of the first sidewall 15a is at most 20 nm under these conditions, then the gap is 0.21 $\mu$m. Accordingly, even if the overall protective film 12 with a thickness of 50 nm or less is deposited, the gap between the adjacent gate electrodes 3a is not completely filled in with the overall protective film 12.

In other words, a contact hole can also be formed to reach a source or drain region 9 shared between a pair of gate electrodes 3a of adjacent MIS transistors just like the contact holes for the other source/drain regions 9. It should be noted that the pocket implanted regions Rpo are not necessarily formed. However, if the pocket implanted regions Rpo are formed, then the punchthrough phenomenon can be suppressed effectively, and these regions are preferably formed for an MIS transistor with an LDD structure in general.

Figure 7B:
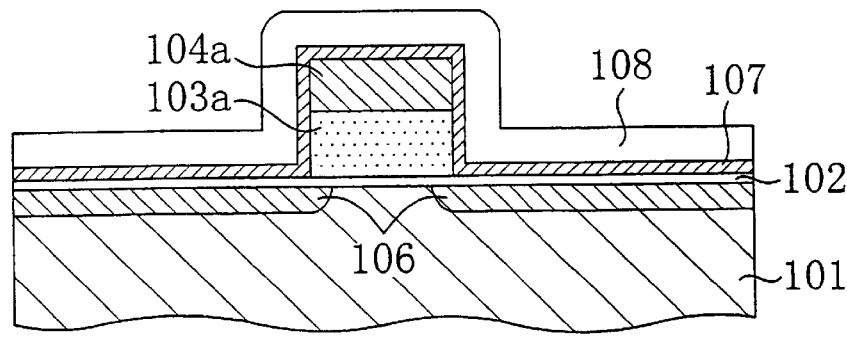
Figure 7C:
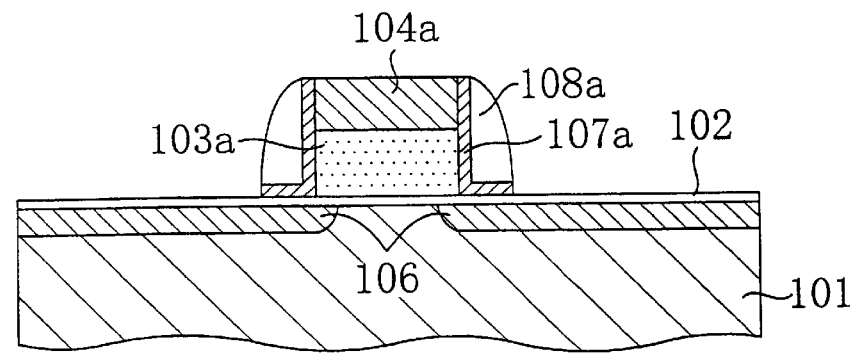
Figure 7D:
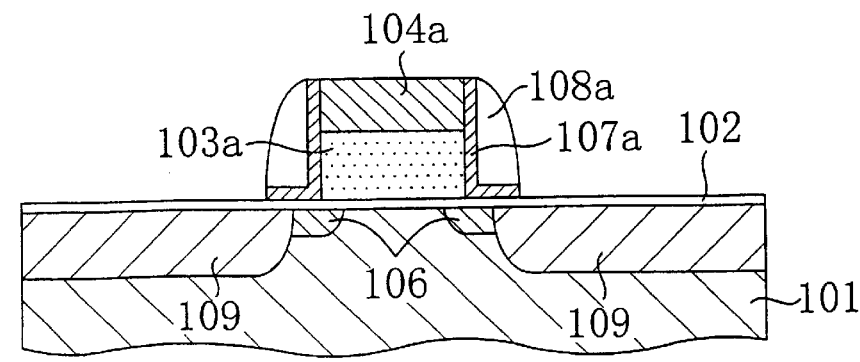
Figure 8:
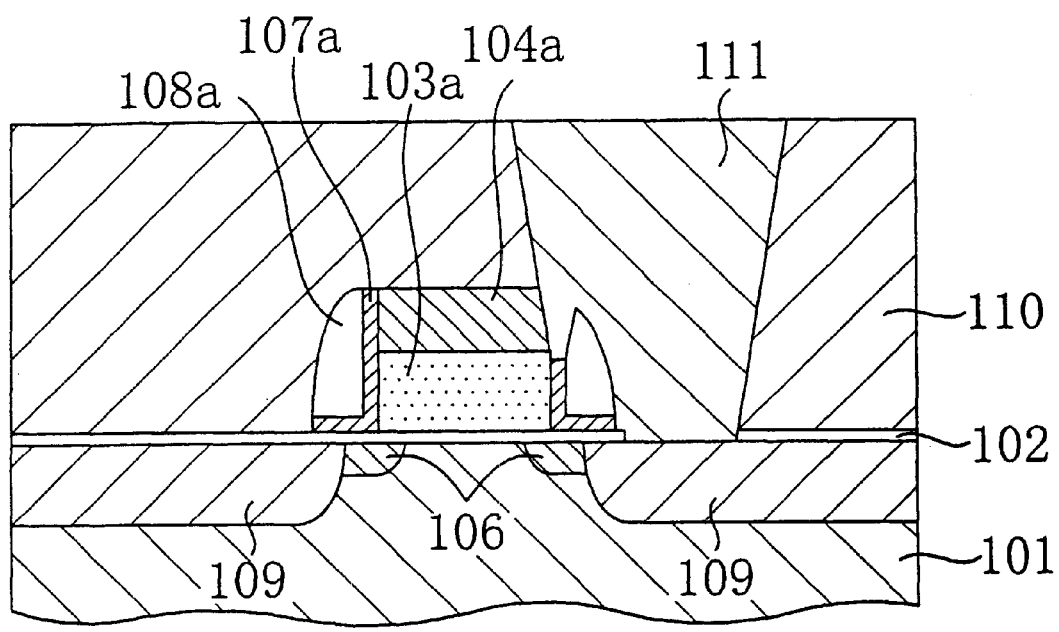
FIG. 8 is a cross-sectional view illustrating a problem involved with the conventional method for fabricating a semiconductor device including known self-aligned contacts.

In such a case, according to the conventional process, dopant ions should be implanted to form the pocket implanted regions in the process step shown in FIG. 7(b) or 7(d). And the lightly- and heavily-doped source/drain regions should be partitioned only by changing the ion implant angle and implant energy. In contrast, according to this embodiment, the lightly-doped source/drain regions 6 (or extension regions) can be easily partitioned from the heavily-doped source/drain regions 9 only by using the first sidewall 15a as a mask.

According to the present invention, the overall protective film 12 should be made of a material showing a high etch selectivity with respect to the interlevel dielectric film 10. In general, an interlevel dielectric film is a silicon dioxide film doped with some impurity, e.g., a BPSG film. Thus, according to the present invention, the overall protective film 12 is preferably a silicon nitride film showing a high etch selectivity with respect to the BPSG film. However, any other insulating film, like an NSG film or a silicon oxynitride film, may also be used so long as a sufficient etch selectivity is attainable with respect to the interlevel dielectric film 10.

The same statement is also applicable to the second and third embodiments to be described later.

Also, the first sidewall 15a needs to be made of such a material as not causing any stress in the gate electrode 3a or Si substrate 1. And the second sidewall 16a needs to be made of a material showing a high etch selectivity with respect to the first sidewall 15a, gate insulating film 2 or Si substrate 1.

Accordingly, any combination of materials other than that exemplified in the foregoing embodiment may also be used. For example, the first sidewall 15a may be a doped or non-doped silicon dioxide film and the second sidewall 16a may be silicon nitride film, polysilicon film, metal film, organic film or carbon film. As a further alternative, the first and second sidewalls 15a and 16a may both be made of silicon dioxide. In such a case, however, the doping levels of these sidewalls should be definitely different from each other to ensure a high etch selectivity. Since the first sidewall 15a is in contact with the gate insulating film 2, the first sidewall 15a is preferably made of silicon dioxide doped at the lower level. The same statement is also applicable to the second and third embodiments to be described later.

Moreover, the on-gate protective layer 4a should only be made of an insulating material and need not show a high etch selectivity with respect to the interlevel dielectric film 10. However, even if the overall protective film 12 shows a high etch selectivity with respect to the interlevel dielectric film 10, portion of the overall protective film 12 just over the on-gate protective layer 4a sometimes may have been removed before the contact hole has gone through the thick interlevel dielectric film 10. Thus, the on-gate protective layer 4a is also preferably made of a material showing a high selectivity with respect to the interlevel dielectric film 10, e.g., silicon nitride. The same statement is also applicable to the second and third embodiments to be described later.

Embodiment 2

FIGS. 4(a) through 4(d) are cross-sectional views illustrating respective process steps for fabricating an n-channel MIS transistor, which is an exemplary semiconductor device according to a second embodiment of the present invention. As a matter of principle, the same process steps as those illustrated in FIGS. 4(a) through 4(d) are performed to form a p-channel MIS transistor, although the conductivity types of dopants implanted into respective parts of the MIS transistor are reversed in such a case.

Figure 4A:
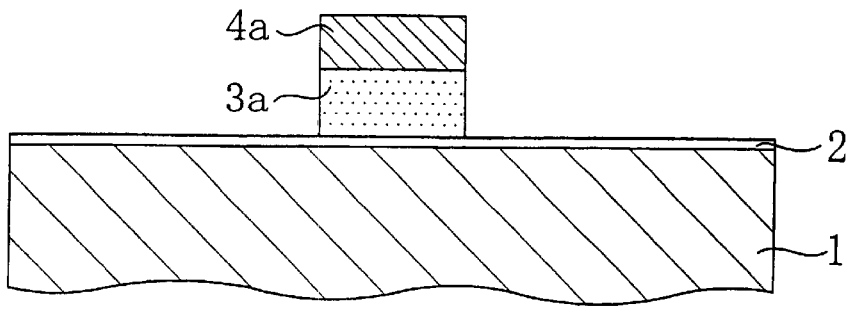
FIGS. 4(a) through 4(d) are cross-sectional views illustrating respective process steps for fabricating a semiconductor device according to a second embodiment of the present invention up to a point in time lightly-doped source/drain regions are formed.

First, in the process step shown in FIG. 4(a), field oxide regions (not shown) are formed on an Si substrate 1, and the following process steps are performed to form an MIS transistor in an active region surrounded by the field oxide regions. Specifically, the principal surface of the Si substrate 1 is thermally oxidized to form a silicon dioxide film thereon to a thickness of about 3 nm. Then, the silicon dioxide film is nitrided, thereby forming a gate insulating film 2 of silicon oxynitride. Thereafter, a gate electrode 3a of polysilicon and an on-gate protective layer 4a of silicon nitride are formed in this order on the gate insulating film 2. In this case, the same process step as the conventional one illustrated in FIG. 7(a) is performed although not shown. Specifically, a polysilicon film and a silicon nitride film are deposited and patterned by photolithography and dry etching, thereby forming the gate electrode 3a and the on-gate protective layer 4a. It should be noted that an n-type dopant (or a p-type dopant for a p-channel MIS transistor) has been introduced into the gate electrode 3a.

Figure 4B:
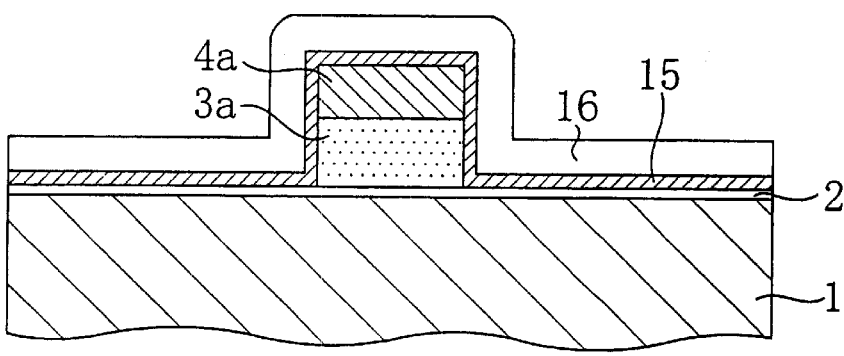

Next, in the process step shown in FIG. 4(b), a thin non-doped oxide film 15 (e.g., an NSG film) is deposited over the entire surface of the substrate to a thickness of 10 to 20 nm. Then, a doped oxide film 16 (e.g., a BPSG, PSG or BSG film) is deposited thereon to a thickness of 40 to 60 nm.

Figure 4C:
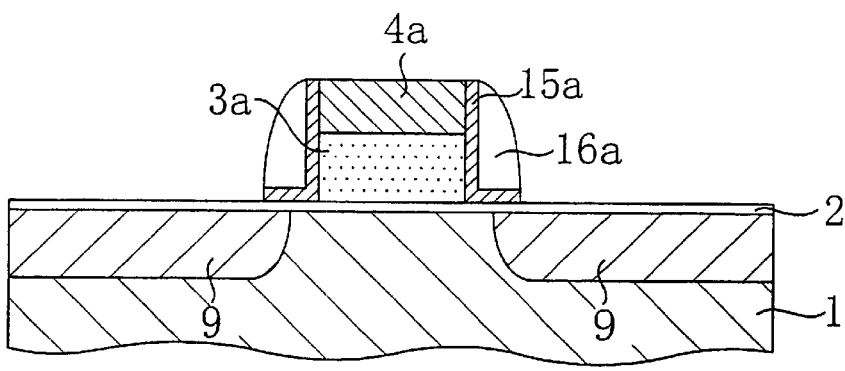

Subsequently, in the process step shown in FIG. 4(c), these oxide films 15 and 16 are etched anisotropically, thereby forming first and second sidewalls 15a and 16a on the sides of the gate electrode 3a. Then, using the gate electrode 3a, on-gate protective layer 4a and respective sidewalls 15a and 16a as a mask, arsenic ions are implanted at a tilt angle of 7 degrees, with an acceleration voltage of 30 to 50 keV applied and at a dose of about 3 to about $5 \times 10^{15}/cm^2$, thereby forming heavily-doped source/drain regions 9. Subsequently, a first RTA process is conducted at a temperature of 900° C. to 1000° C. for 10 to 30 seconds to activate the dopants introduced into the heavily-doped source/drain regions 9.

It should be noted that a thin nitride film may be interposed between the first and second sidewalls 15a and 16a.

Figure 4D:
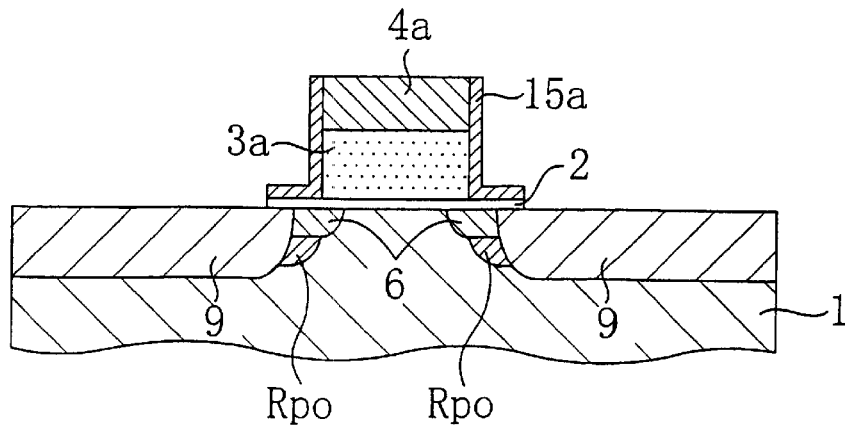

Next, in the process step shown in FIG. 4(d), only the second sidewall 16a is selectively removed so as to leave the first sidewall 15a. This selective etching can be performed easily as HF vapor phase etching. This is because in performing HF vapor phase etching, the etch rate of a doped oxide film such as a BPSG film is about two orders of magnitude higher than that of a non-doped oxide film such as an NSG film. Thus, the doped oxide film can be selectively removed easily. In this process step, portion of the gate insulating film 2, which is exposed on the substrate, is often etched away depending on the over-etch distance thereof.

Thereafter, using the gate electrode 3a, on-gate protective layer 4a and first sidewall 15a as a mask, P+ (phosphorus) ions are implanted at a tilt angle of 7 to 40 degrees, with an acceleration voltage of 20 to 30 keV applied and at a dose of about $5 \times 10^{13}/cm^2$, thereby forming lightly-doped source/drain regions 6. It should be noted that extension regions may be formed instead of the lightly-doped source/drain regions 6. In such a case, As (arsenic) ions are implanted at a dose of $5 \times 10^{14}/cm^2$ with an acceleration voltage of 10 to 20 keV applied.

Then, using the gate electrode 3a, on-gate protective layer 4a and first sidewall 15a as a mask, boron (or boron fluoride) ions are implanted at a tilt angle of 20 to 40 degrees, with an acceleration voltage of 10 to 50 keV applied and at a dose of about 1 to about $5 \times 10^{13}/cm^2$, thereby forming pocket implanted regions Rpo as a punchthrough stopper. The pocket implanted regions Rpo need not be formed.

Subsequently, a second RTA process is conducted at a temperature of 850° C. to 900° C. for 10 to 30 seconds to activate the dopants introduced into the lightly-doped source/drain regions 6 and the pocket implanted regions Rpo.

Then, as in the first embodiment, the process steps of forming self-aligned contacts are also performed as shown in FIGS. 2(a) through 2(c).

According to this embodiment, the same effects as those attained by the first embodiment are also attainable, because the overall protective film 12 is deposited after the second sidewall 16a has been removed. That is to say, a semiconductor device with an SAC structure can be formed without completely filling in the gap between adjacent gate electrodes 3a with the overall protective film 12.

In addition, according to the second embodiment, the first RTA process is conducted after the heavily-doped source/drain regions 9 have been formed. Then, the second RTA process is conducted at a temperature lower than that of the first RTA process after the lightly-doped source/drain regions 6 have been formed. Accordingly, the diffusion ranges of the lightly-doped source/drain regions 6 can be narrower compared to the first embodiment. As a result, an MIS transistor highly resistant to short-channel effects can be formed. Specifically, to suppress leakage in heavily-doped source/drain regions 9 with the surface thereof silicided as in an MIS transistor with a salicide structure and to reduce the junction capacitance, the heavily-doped source/drain regions 9 should be formed relatively deep by diffusion. However, if annealing is conducted at an overly high temperature for that purpose, then the lightly-doped source/drain regions 6 (or extension regions) excessively expand to enhance the short-channel effects unintentionally. In contrast, if annealing is conducted in advance to activate the heavily-doped source/drain regions 9 as in this embodiment, the dopant concentration profiles in the lightly-doped source/drain regions 6 (or extension regions), pocket implanted regions Rpo and heavily-doped source/drain regions 9 can be easily controlled at respective desired levels. As a result, short-channel effects such as punch-through can be suppressed with a lot more certainty.

Embodiment 3

FIGS. 5(a) through 6(b) are cross-sectional views illustrating respective process steps for fabricating an n-channel MIS transistor, which is an exemplary semiconductor device according to a third embodiment of the present invention. As a matter of principle, the same process steps as those illustrated in FIGS. 5(a) through 6(b) are performed to form a p-channel MIS transistor, although the conductivity types of dopants implanted into respective parts of the MIS transistor are reversed in such a case. According to the third embodiment, the process step of turning respective surface regions of the heavily-doped source/drain regions 9 into silicide is further performed in addition to all the process steps of the second embodiment. Also, it is supposed that a silicon layer, which is not turned into a silicide in the silicidation process step (or a non-silicide region, e.g., source/drain regions of a memory cell transistor), is exposed on the substrate. In the following exemplary embodiment, the present invention will be described as being applied to such a silicide region.

Figure 5A:
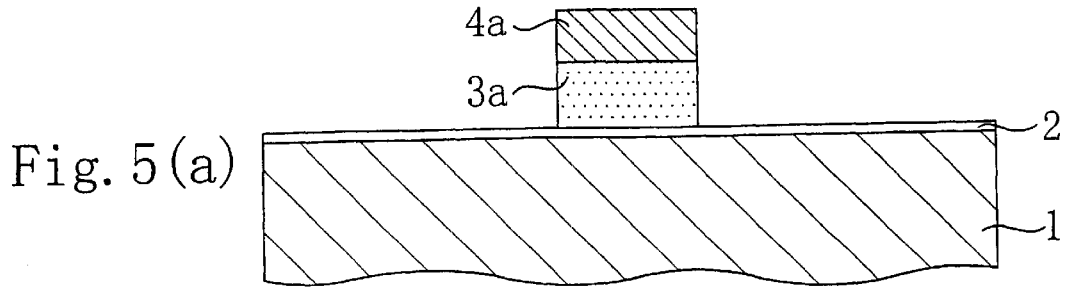
FIGS. 5(a) through 5(d) are cross-sectional views illustrating respective process steps for fabricating a semiconductor device according to a third embodiment of the present invention up to a point in time N$^-$ regions for preventing leakage are formed.

First, in the process step shown in FIG. 5(a), field oxide regions (not shown) are formed on an Si substrate 1, and the following process steps are performed to form an MIS transistor in an active region surrounded by the field oxide regions. Specifically, the principal surface of the Si substrate 1 is thermally oxidized to form a silicon dioxide film thereon to a thickness of about 3 nm. Then, the silicon dioxide film is nitrided, thereby forming a gate insulating film 2 of silicon oxynitride. Thereafter, a gate electrode 3a of polysilicon and an on-gate protective layer 4a of silicon nitride are formed in this order on the gate insulating film 2. In this case, the same process step as the conventional one illustrated in FIG. 7(a) is performed although not shown. Specifically, a polysilicon film and a silicon nitride film are deposited and patterned by photolithography and dry etching, thereby forming the gate electrode 3a and the on-gate protective layer 4a. It should be noted that an n-type dopant (or a p-type dopant for a p-channel MIS transistor) has been introduced into the gate electrode 3a.

Figure 5B:
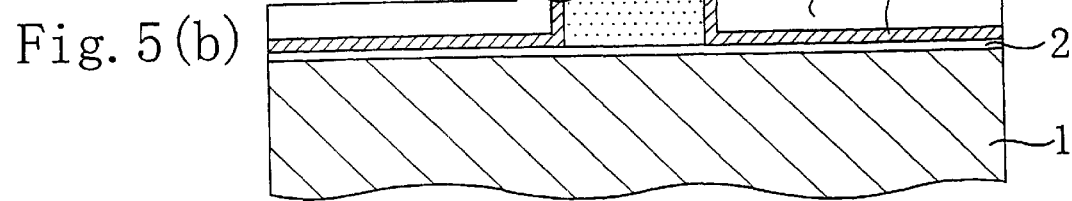

Next, in the process step shown in FIG. 5(b), a thin non-doped oxide film 15 (e.g., an NSG film) is deposited over the entire surface of the substrate to a thickness of 10 to 20 nm. Then, a doped oxide film 16 (e.g., a BPSG, PSG or BSG film) is deposited thereon to a thickness of 40 to 60 nm.

Figure 5C:
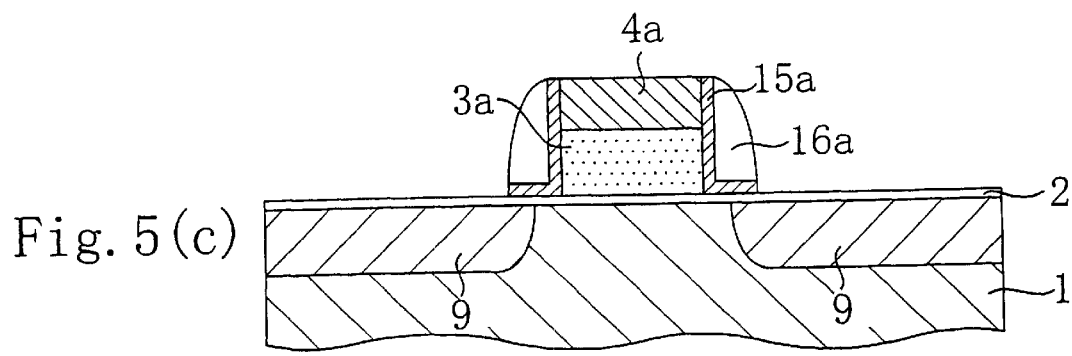

Subsequently, in the process step shown in FIG. 5(c), these oxide films 15 and 16 are etched anisotropically, thereby forming first and second sidewalls 15a and 16a on the sides of the gate electrode 3a. Then, using the gate electrode 3a, on-gate protective layer 4a and respective sidewalls 15a and 16a as a mask, arsenic ions are implanted at a tilt angle of 7 degrees, with an acceleration voltage of 30 to 50 keV applied and at a dose of about 3 to about $5 \times 10^{15}/cm^2$, thereby forming heavily-doped source/drain regions 9. Subsequently, a first RTA process is conducted at a temperature of 900° C. to 1000° C. for 10 to 30 seconds to activate the dopants introduced into the heavily-doped source/drain regions 9.

It should be noted that a thin nitride film may be interposed between the first and second sidewalls 15a and 16a.

Figure 5D:
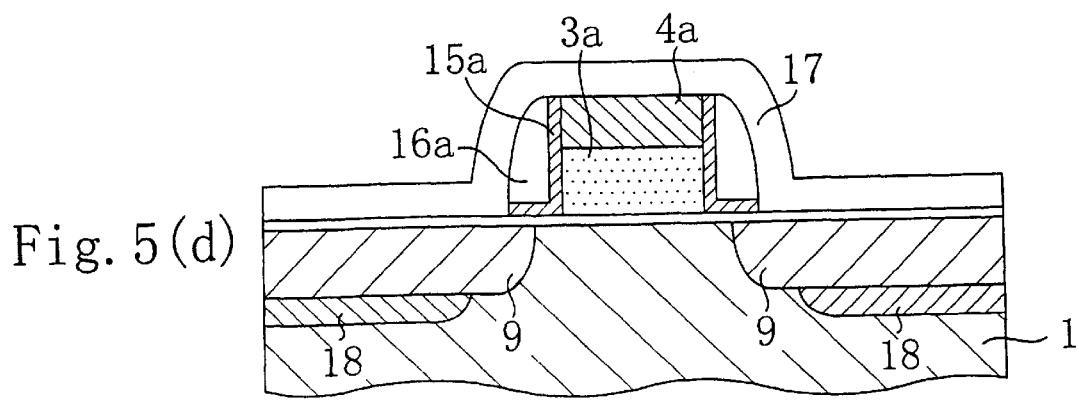

Next, in the process step shown in FIG. 5(d), a silicon dioxide film 17 is deposited over the entire surface of the substrate to a thickness of about 100 nm. The silicon dioxide film 17 will be used to mask a non-silicide region (e.g., an array of memory cells (not shown)) in the subsequent silicidation process step. Before the silicon dioxide film 17 is patterned, phosphorus ions are implanted into the Si substrate 1 at a tilt angle of 7 degrees, with an acceleration voltage of 150 keV to 200 keV applied and at a dose of $1.0 \times 10^{14}/cm^2$ to $1.0 \times 10^{15}/cm^2$. As a result, in the silicide region shown in FIG. 5(d), the silicon dioxide film 17, as well as the gate electrode 3a, on-gate protective layer 4a and respective sidewalls 15a and 16a, functions as a mask. Accordingly, N⁻ regions 18 are formed under the heavily-doped source/drain regions 9 to be distant from the gate electrode 3a.

By providing these N⁻ regions 18, the junction capacitance and leakage current between the source/drain regions can be reduced.

Figure 6A:
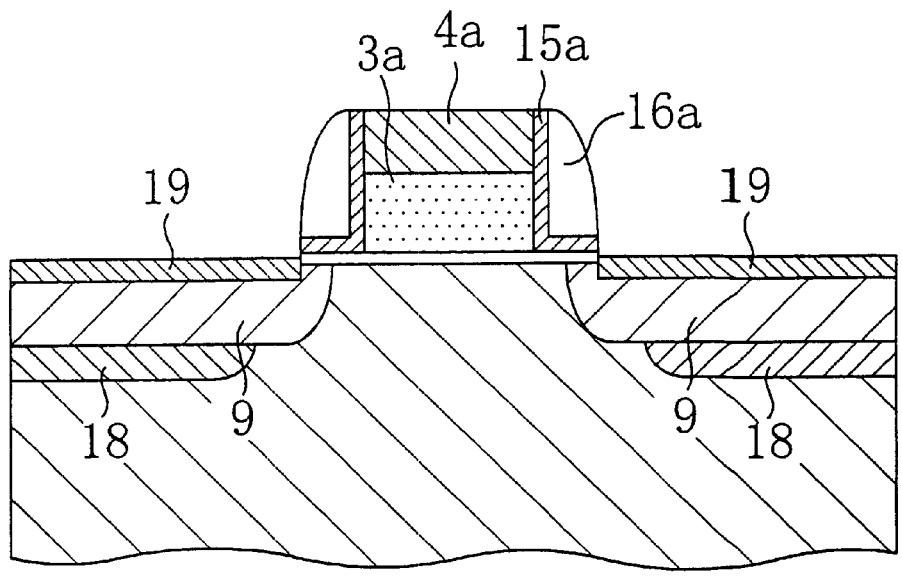
FIGS. 6(a) and 6(b) are cross-sectional views illustrating silicidation process steps in the method for fabricating a semiconductor device according to the third embodiment.

Next, in the process step shown in FIG. 6(a), the silicon dioxide film 17 is etched and patterned using a photoresist film as a mask. Although not shown, portion of the silicon dioxide film 17 is left in the non-silicide region, but the other portion thereof has been removed in the silicide region shown in FIG. 6(a).

Thereafter, a refractory metal film such as Ti or W is deposited over the substrate, and heat treatment is conducted to allow the refractory metal to react with silicon on the surface of the heavily-doped source/drain regions 9. After non-reacted portions of the refractory metal layer have been removed, heat treatment is conducted again to stabilize the structure of the resultant silicide and thereby form a silicide film 19 over the heavily-doped source/drain regions 9.

Figure 6B:
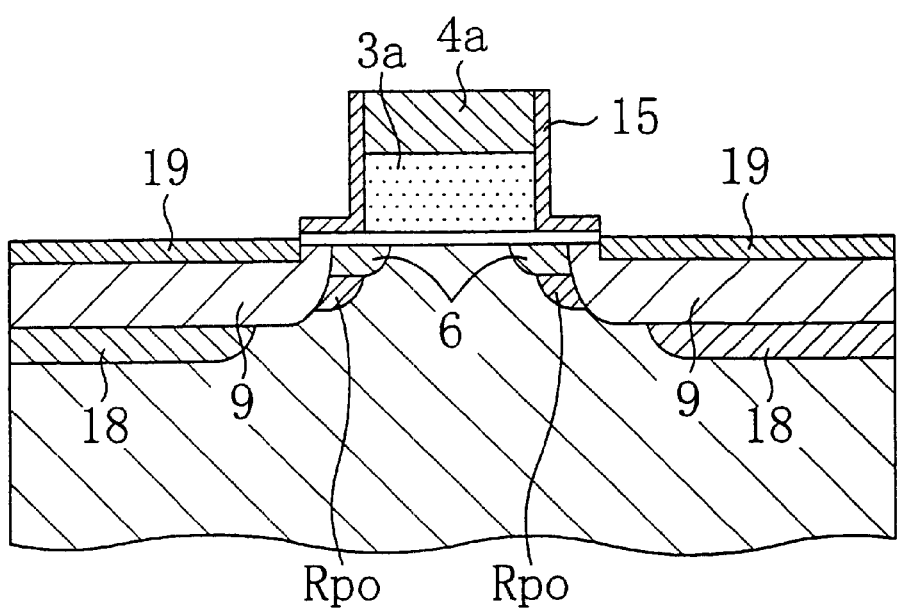

Subsequently, in the process step shown in FIG. 6(b), only the second sidewall 16a is selectively removed so as to leave the first sidewall 15a. This selective etching can be performed easily as HF vapor phase etching. This is because in performing HF vapor phase etching, the etch rate of a doped oxide film such as a BPSG film is about two orders of magnitude higher than that of a non-doped oxide film such as an NSG film. Thus, the doped oxide film can be selectively removed easily.

Thereafter, using the gate electrode 3a, on-gate protective layer 4a and first sidewall 15a as a mask, P⁺ (phosphorus) ions are implanted at a tilt angle of 7 to 40 degrees, with an acceleration voltage of 20 to 30 keV applied and at a dose of about $5 \times 10^{13}/cm^2$, thereby forming lightly-doped source/drain regions 6. It should be noted that extension regions may be formed instead of the lightly-doped source/drain regions 6. In such a case, As (arsenic) ions are implanted at a dose of $5 \times 10^{14}/cm^2$ with an acceleration voltage of 10 to 20 keV applied.

Then, using the gate electrode 3a, on-gate protective layer 4a and first sidewall 15a as a mask, boron (or boron fluoride) ions are implanted at a tilt angle of 20 to 40 degrees, with an acceleration voltage of 10 to 50 keV applied and at a dose of about 1 to about $5 \times 10^{13}/cm^2_1$, thereby forming pocket implanted regions Rpo as a punchthrough stopper. The pocket implanted regions Rpo need not be formed.

Subsequently, a second RTA process is conducted at a temperature of 850° C. to 900° C. for 10 to 30 seconds to activate the dopants introduced into the lightly-doped source/drain regions 6 and the pocket implanted regions Rpo.

Then, as in the first embodiment, the process steps of forming self-aligned contacts are also performed as shown in FIGS. 2(a) through 2(c).

In the foregoing description, the silicidation process step is further performed in addition to all the process steps of the second embodiment. Alternatively, the silicidation process step may be added to the process steps of the first embodiment. In such a case, after the process step shown in FIG. 1(c) has been performed, the silicon dioxide film 17 is deposited, $N^{31}$ regions 18 are formed by ion implantation and then the silicon dioxide film 17 is patterned. Thereafter, the silicidation process step illustrated in FIGS. 6(a) and 6(b) may be performed and then the process step shown in FIG. 1(d) may be performed.

It should be noted that the process step shown in FIG. 5(d) may be performed either after or before a photoresist film covering the non-silicide region is formed.

According to the third embodiment, the following effects are attainable in addition to those attained by the first and second embodiments.

The $N^{31}$ regions 18 are formed under the heavily-doped source/drain regions 9 in a state just before the silicon dioxide film 17, which is used to mask the non-silicide region, is patterned. Accordingly, even if the surface of the heavily-doped source/drain regions 9 is turned into a silicide, the leakage current does not increase. In addition, since the junction capacitance between the heavily-doped source/drain regions 9 can be reduced, the MIS transistor can operate at a higher speed.

What is claimed is:

1. A semiconductor device comprising:
   a semiconductor substrate including a substrate region containing a dopant of a first conductivity type;
   a gate insulating film and a gate electrode formed on the substrate region;
   an on-gate protective layer formed on the gate electrode;
   an insulator sidewall formed on respective sides of the gate electrode and the on-gate protective layer and the on-gate protective layer and under the gate insulating film, the insulator sidewall having an L-shape cross section;
   doped regions formed respectively on both sides of the insulator sidewall in the semiconductor substrate, the doped regions containing a dopant of a second conductivity type;
   an overall protective film covering the doped regions, the on-gate protective layer and the insulator sidewall having an L-shaped cross section;
   an interlevel dielectric film formed over the overall protective film and made of an insulating material that is able to be etched selectively with respect to the overall protective film;
   openings formed through the interlevel dielectric film and the overall protective film to reach the respective doped regions; and
   plug electrodes filing the openings and made of a conductive material,
   wherein the overall protective film is directly formed over an inside a surface of the insulator sidewall having an L-shaped cross section.

2. The device of claim 1 further comprising lightly-doped regions respectively formed between a portion under the gate electrode and the doped layer in the substrate region, the lightly-doped regions containing a dopant of a second conductivity type at a lower concentration than that of the doped regions.

3. The device of claim 2 further comprising pocket diffusion regions formed under the lightly-doped regions in the semiconductor substrate, the pocket diffusion regions containing a dopant of a first conductivity type.

4. The device of claim 1, wherein the insulator sidewall is composed of a non-doped oxide film and the covered insulating film is composed of a silicon nitride film.

5. The device of claim 1, wherein
   each of the openings is formed so as to expose a part of the on-gate protective layer and a part of the insulator sidewall, and
   another sidewall made of the covered insulating film is formed on the side of the part of the insulator sidewall exposed in the respective openings.

6. The device of claim 1 further comprising doped regions for preventing leakage formed under the doped regions and in a side of the insulator sidewall in the substrate region, the doped regions for preventing leakage containing a dopant of a second conductivity at a lower concentration than that of the doped regions.

7. The device of claim 1 further comprising a silicide layer formed on the doped regions.

8. The device of claim 1, wherein the gate insulating film extends to be sandwiched between the insulator sidewall and the semiconductor substrate.

9. A semiconductor device comprising;
   a gate insulating film and a gate electrode formed over a semiconductor substrate;
   an insulator sidewall formed at least over respective sides of the gate electrode over the semiconductor substrate, the insulator sidewall having an L-shape cross section;
   an overall protective film covering the semiconductor substrate where the gate electrode and the insulator sidewall are formed; and
   an interlevel dielectric film formed over the overall protective film and made of an insulating material that is able to be etched selectively with respect to the overall protective film,
   wherein the overall protective film is directly formed over an inside surface of the insulator sidewall having an L-shape cross-section.

10. The device of claim 9 further comprising:
    at least a doped region formed in the semiconductor substrate arranged on a side of the insulator sidewall;
    at least an opening formed through the interlevel dielectric film and the overall protective film to reach the doped region; and
    at least a plug electrode filing the opening and made of a conductive material.

11. The device of claim 10 further comprising a silicide layer formed on the doped region.

12. The device of claim 9, wherein the gate insulating film extends to be sandwiched between the insulator sidewall and the semiconductor substrate.

13. The device of claim 9, wherein the interlevel dielectric film is flattened on the surface.

14. The device of claim 9 further comprising:
the semiconductor substrate containing a dopant of a first conductivity type;
lightly-doped regions respectively formed between a portion under the gate electrode and the doped layer in the semiconductor substrate, the lighty-doped regions containing a dopant of a second conductivity type at a lower concentration than that of the doped regions.

15. The device of claim 14 further comprising pocket diffusion regions formed under the lighty-doped regions in the semiconductor substrate, the pocket diffusion regions containing a dopant of a first conductivity type.

16. The device of claim 9, wherein the insulator sidewall is composed of a non-doped oxide film and the overall protective film is composed of silicon nitride.

* * * * *

UNITED STATES PATENT AND TRADEMARK OFFICE
CERTIFICATE OF CORRECTION

PATENT NO.      : 6,492,665 B1                                    Page 1 of 1
DATED           : December 10, 2002
INVENTOR(S)     : Susumu Akamatsu et al.

It is certified that error appears in the above-identified patent and that said Letters Patent is hereby corrected as shown below:

<u>Title page,</u>
Item [56], References Cited, FOREIGN PATENT DOCUMENTS,
please delete "JP 03-110729" and add -- JP 03-220729 --

<u>Column 13,</u>
Line 51, after word "layer" delete "and the on-gate protective layer"

<u>Column 14,</u>
Lines 17 and 18, change "covered insulating" to -- overall protective --
Line 23, change "covered insulating" to -- overall protective --

Signed and Sealed this

Second Day of September, 2003

JAMES E. ROGAN
*Director of the United States Patent and Trademark Office*